US008264238B1

(12) United States Patent
El-Chouelry (10) Patent No.: US 8,264,238 B1
(45) Date of Patent: Sep. 11, 2012

(54) METHOD FOR CALIBRATING A BROADBAND VOLTAGE/CURRENT PROBE

(75) Inventor: Riad E. El-Chouelry, Rochester, NY (US)

(73) Assignee: MKS Instruments, Inc., Andover, MA (US)

( * ) Notice: Subject to any disclaimer, the term of this patent is extended or adjusted under 35 U.S.C. 154(b) by 564 days.

(21) Appl. No.: 12/483,717

(22) Filed: Jun. 12, 2009

Related U.S. Application Data

(60) Provisional application No. 61/132,057, filed on Jun. 13, 2008.

(51) Int. Cl.
*G01R 35/00* (2006.01)
(52) U.S. Cl. ........................................... 324/601
(58) Field of Classification Search ................. 324/601
See application file for complete search history.

(56) References Cited

U.S. PATENT DOCUMENTS

| 6,458,611 | B1 * | 10/2002 | Gardner ..................... 438/17 |
| 6,708,123 | B2 | 3/2004 | Gerrish |
| 6,983,215 | B2 | 1/2006 | Coumou et al. |
| 7,326,872 | B2 * | 2/2008 | Shannon ................ 219/121.41 |
| 7,649,363 | B2 * | 1/2010 | Lemson ..................... 324/601 |
| 2007/0139122 | A1 * | 6/2007 | Nagarkatti et al. ........ 330/302 |

* cited by examiner

*Primary Examiner* — Jeff Natalini
(74) *Attorney, Agent, or Firm* — Harness, Dickey & Pierce, P.L.C.

(57) ABSTRACT

A calibration method for performing open circuit and closed circuit calibrations of a voltage/current (VI) probe. In one implementation the method may involve inserting a VI probe into a circuit including a first known load (Load 1) and a applying a first signal to the circuit. A first raw impedance ($Z_{RAW1}$) may be measured using the Load 1. The VI probe may then be inserted into the circuit along with a second known load (Load 2) in place of the Load 1, and a second signal may be applied to the circuit. A second raw impedance ($Z_{RAW2}$) may then be measured using the Load 2. A fixed reference impedance ($Z_{R50}$) may then be defined. The first and second raw impedances, and the fixed reference impedance, may then be used in determining an open circuit impedance ($Z_{OC}$) and a short circuit impedance ($Z_{SC}$). The $Z_{OC}$ and $Z_{SC}$ impedances may then be used to determine a plurality of calibration coefficients for the VI probe.

20 Claims, 12 Drawing Sheets

METHOD FOR CALIBRATING A BROADBAND VOLTAGE/CURRENT PROBE

CROSS REFERENCE TO RELATED APPLICATION

The present application claims priority from U.S. provisional application Ser. No. 61/132,057, filed Jun. 13, 2008, the subject matter of which is also hereby incorporated by reference into the present application.

FIELD

The present disclosure relates to the calibration of electronic measurement instruments, and more particularly to a method for calibrating a broadband voltage/current probe in a manner that significantly reduces measurement error originating from open and short circuit stages of the probe calibration.

BACKGROUND

The statements in this section merely provide background information related to the present disclosure and may not constitute prior art.

With broadband voltage/current (hereinafter "VI") probes, such as the VI probe disclosed in U.S. Pat. No. 6,708,123, hereby incorporated by reference into the present disclosure, a calibration needs to be performed on the VI probe after its assembly. The calibration principally involves determining a linear transformation of the raw voltage and current—received from the RF sensor pickups of the VI probe—into true voltage and current measurements, from which all other relevant parameters can be derived. The transformation is depicted in equation (1) below:

$$\begin{bmatrix} V \\ I \end{bmatrix} = \begin{bmatrix} a & b \\ c & d \end{bmatrix} * \begin{bmatrix} V_v \\ V_i \end{bmatrix} \quad \text{Equation 1}$$

where [a, b; c, d], being the complex calibration coefficients for an individual frequency, and being theoretically valid for all regions in the Smith chart, are given by:

$$a = -\frac{\sqrt{Z_{LDT} * P_{REF}}}{-V_{V50} + Z_{SC} * V_{I50}} \quad \text{Equation 2}$$

$$b = \frac{\sqrt{Z_{LDT} * P_{REF}} * Z_{SC}}{-V_{V50} + Z_{SC} * V_{I50}} \quad \text{Equation 3}$$

$$c = \frac{\sqrt{Z_{LDT} * P_{REF}}}{Z_{LDT} * (-V_{V50} + Z_{OC} * V_{I50})} \quad \text{Equation 4}$$

$$d = \frac{\sqrt{Z_{LDT} * P_{REF}} * Z_{OC}}{Z_{LDT} * (-V_{V50} + Z_{OC} * V_{I50})} \quad \text{Equation 5}$$

As mentioned earlier the true voltage and current are the basis for all other computations. Specifically, the impedance is derived using the four above mentioned calibration coefficients through the following formula:

$$Z = \frac{V}{I} = \frac{a * V_v + B * V_i}{c * V_v + d * V_i} \quad \text{Equation 6}$$

Figure 1:
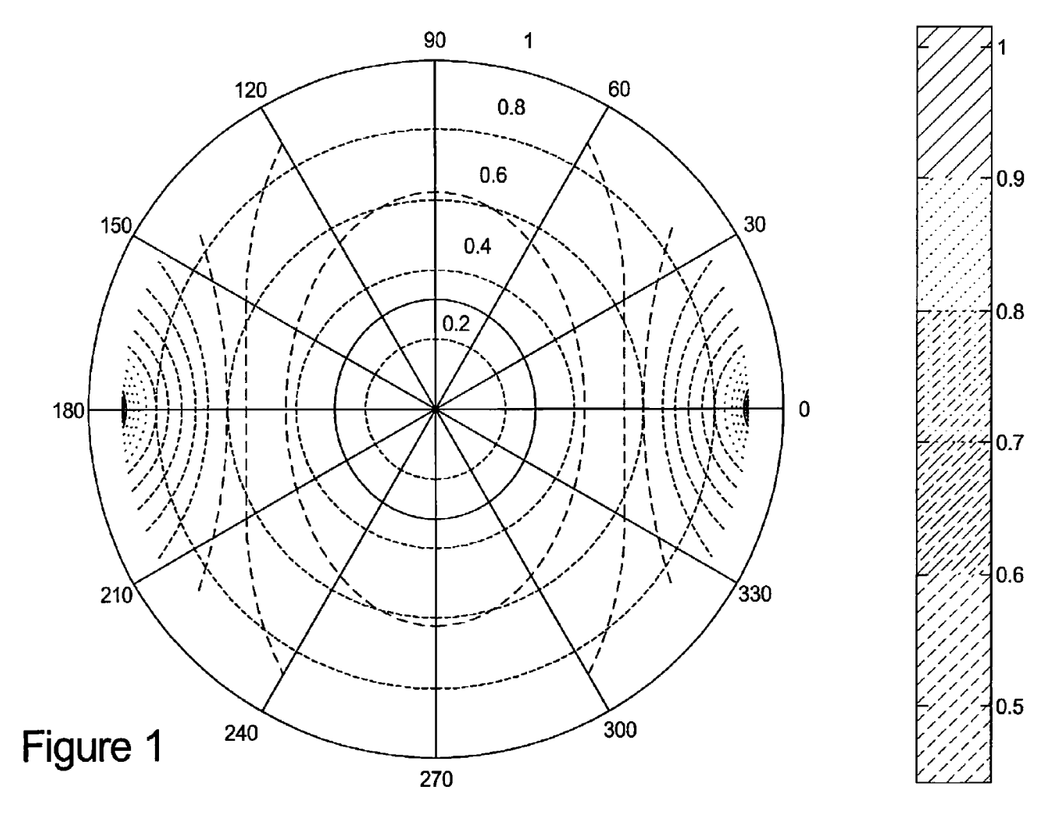
FIG. 1 is a Smith chart plot illustrating the error concentration around the open and the short loads.
Figure 2A:
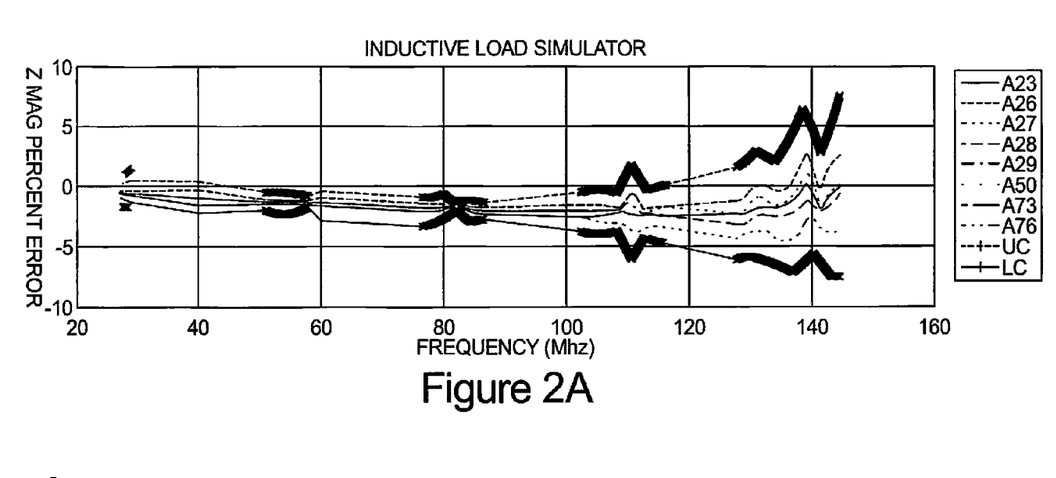
FIGS. 2A and 2B are graphs illustrating the performance degradation of the VI probe as the frequency of the applied RF signal increases.
Figure 2B:
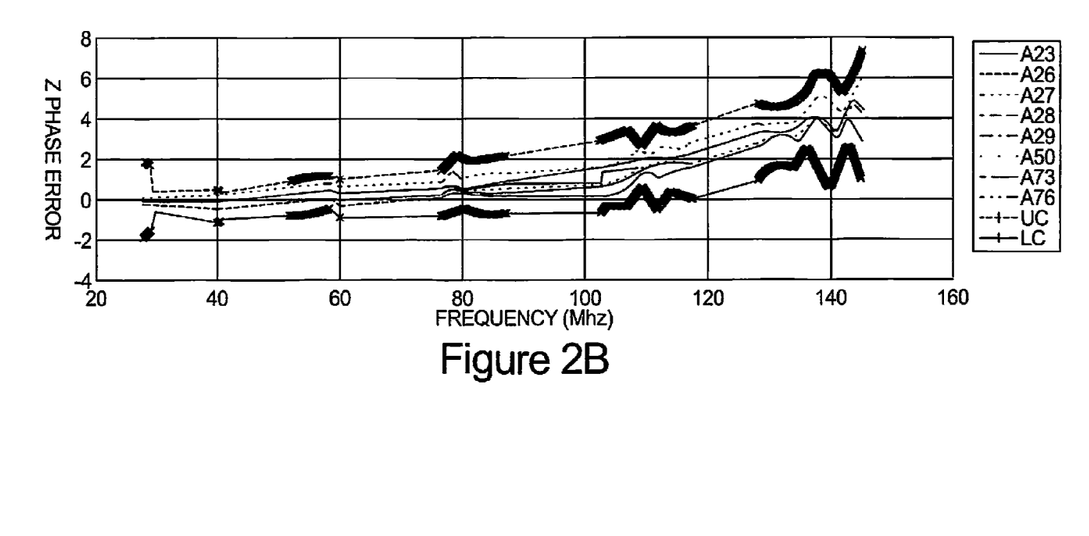
Figure 3:
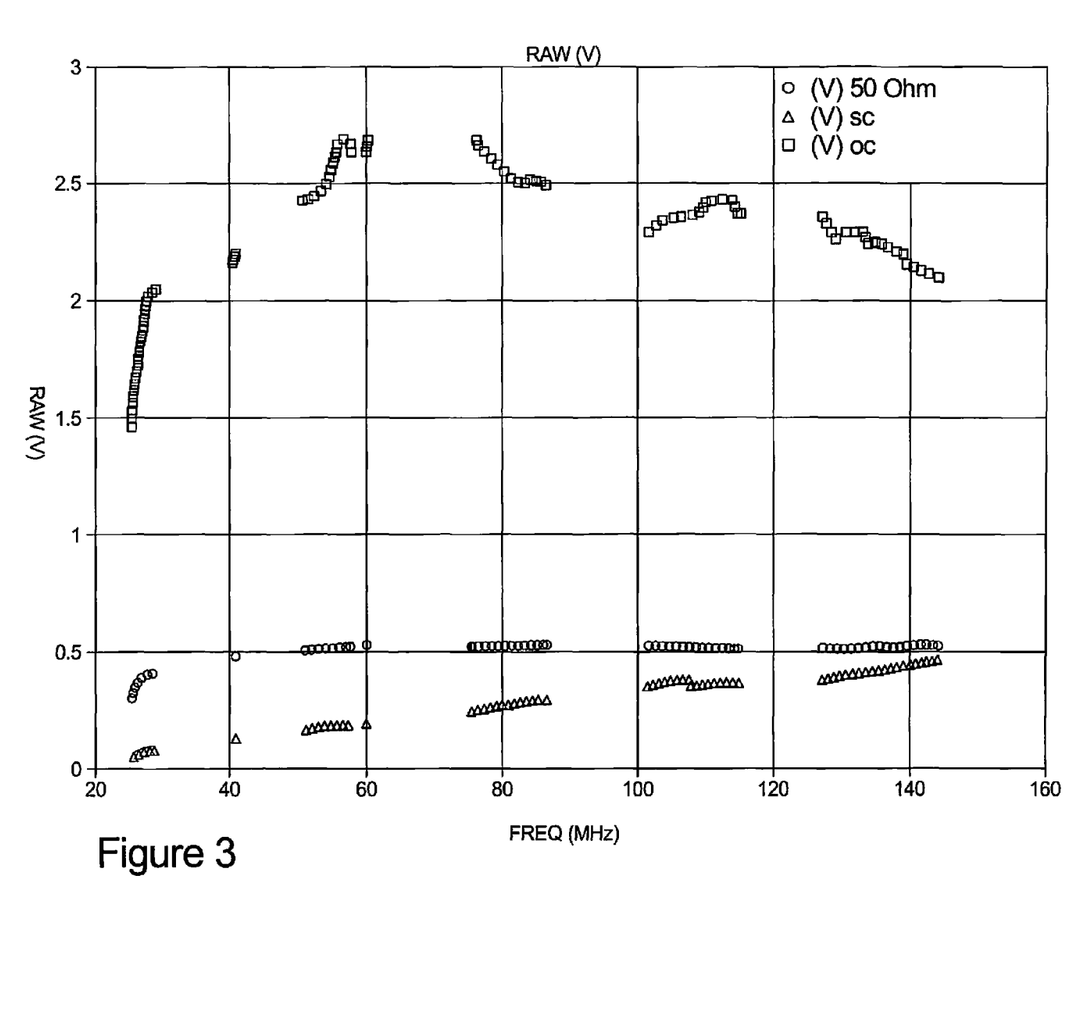
FIG. 3 is an open calibration raw voltage plot for short, open and 50 ohm calibrations.
Figure 4:
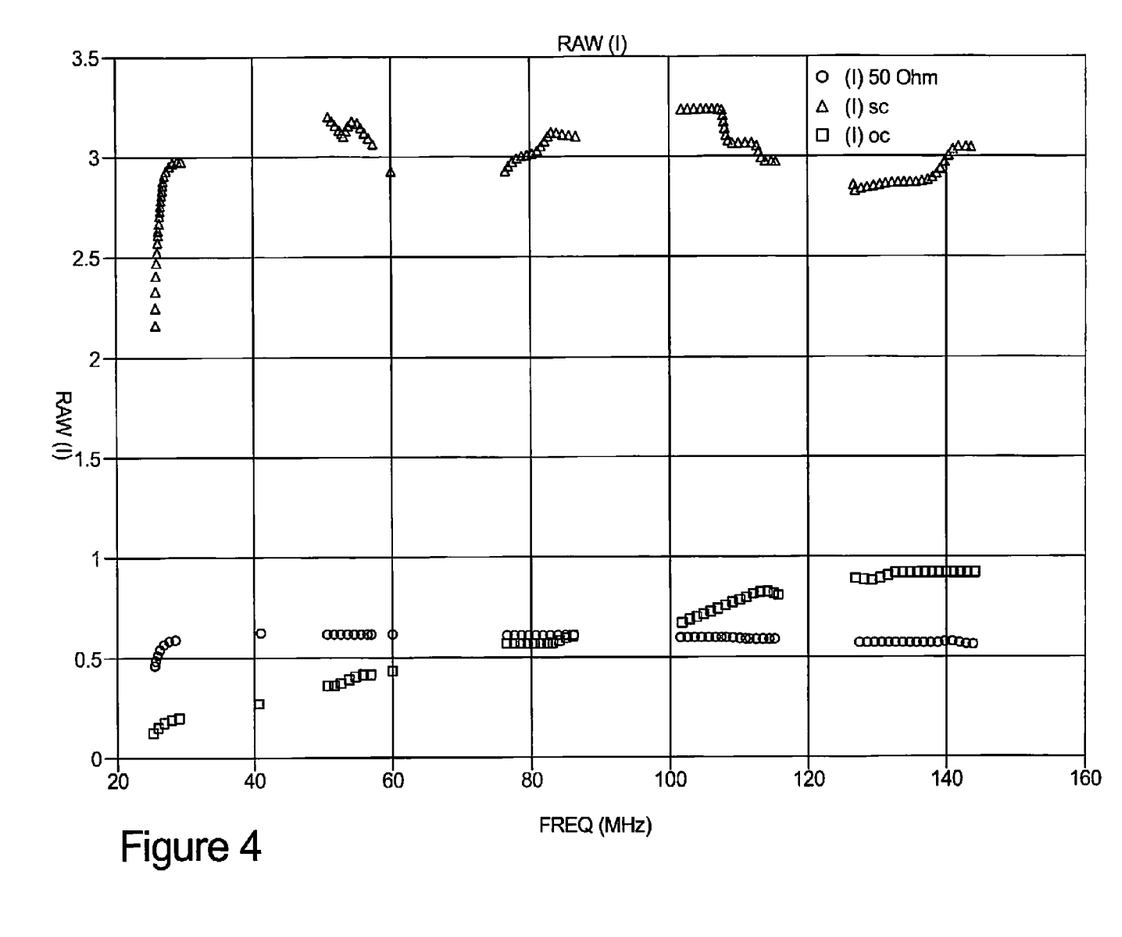
FIG. 4 is a plot of raw current for the short, open and 50 ohm calibrations.
Figure 5:
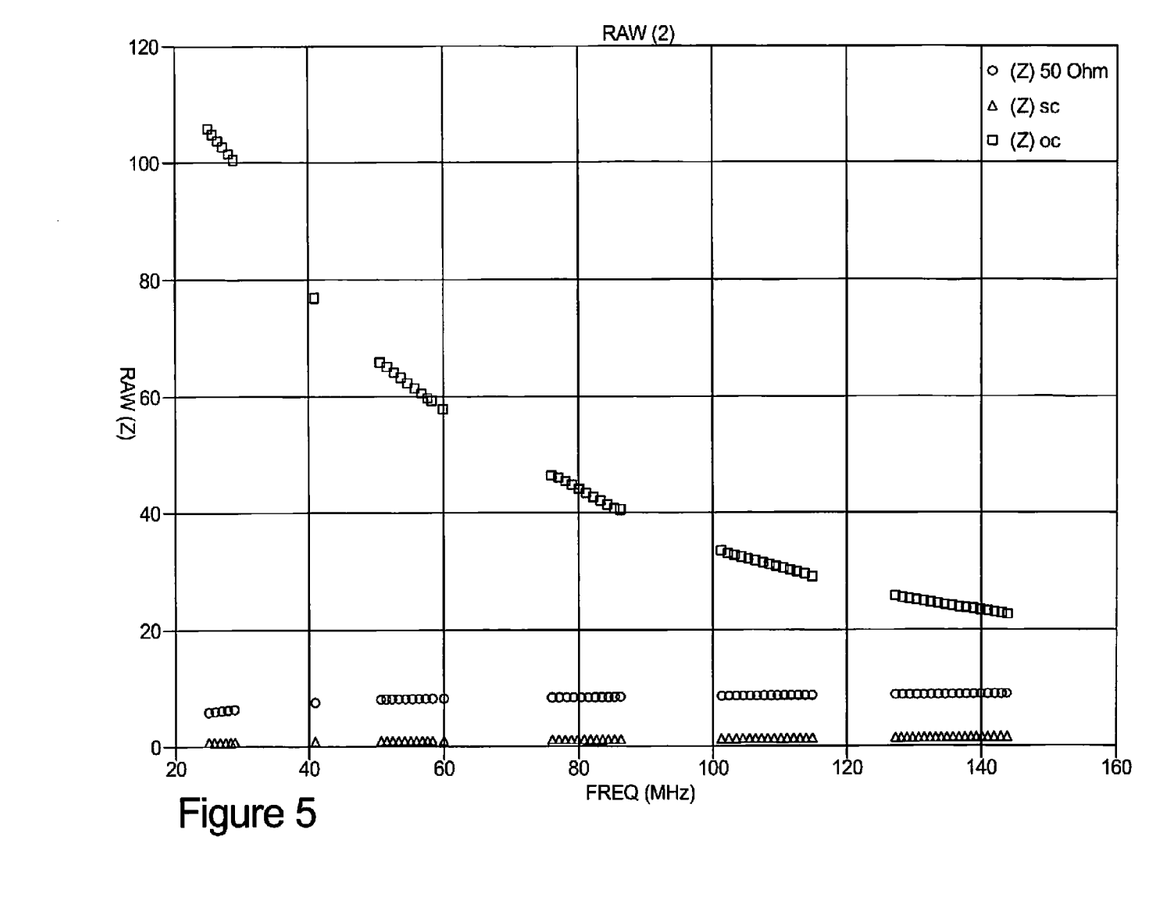
FIG. 5 is a plot illustrating the decrease in the difference between the open, short and 50 ohm impedances.

With a VI probe, some degree of inaccuracy will typically exist. This inaccuracy can be in the range of four to six percent in magnitude for impedance measurements. An internal study conducted by MKS Instruments shows that the impedance measurement error is magnified as it nears the open and short locations on the Smith chart, as illustrated in FIG. 1. Short and open calibrations also affect a VI probe's performance at high frequencies. As the frequency increases, accuracy tends to fluctuate according to some sub-sinusoidal pattern, and VI probe unit-to-unit repeatability tends to degrade at an increasing rate, as can be seen in FIGS. 2A and 2B. The degradation in accuracy and repeatability at higher frequencies can be traced back to an abnormality that occurs during calibration that can be traced by its signature in the open-calibration raw voltage and the short-calibration raw current magnitude plots, as shown in FIGS. 3 and 4. The decrease in the difference between the open, short and 50 ohm impedances can be observed in FIG. 5.

Figure 6:
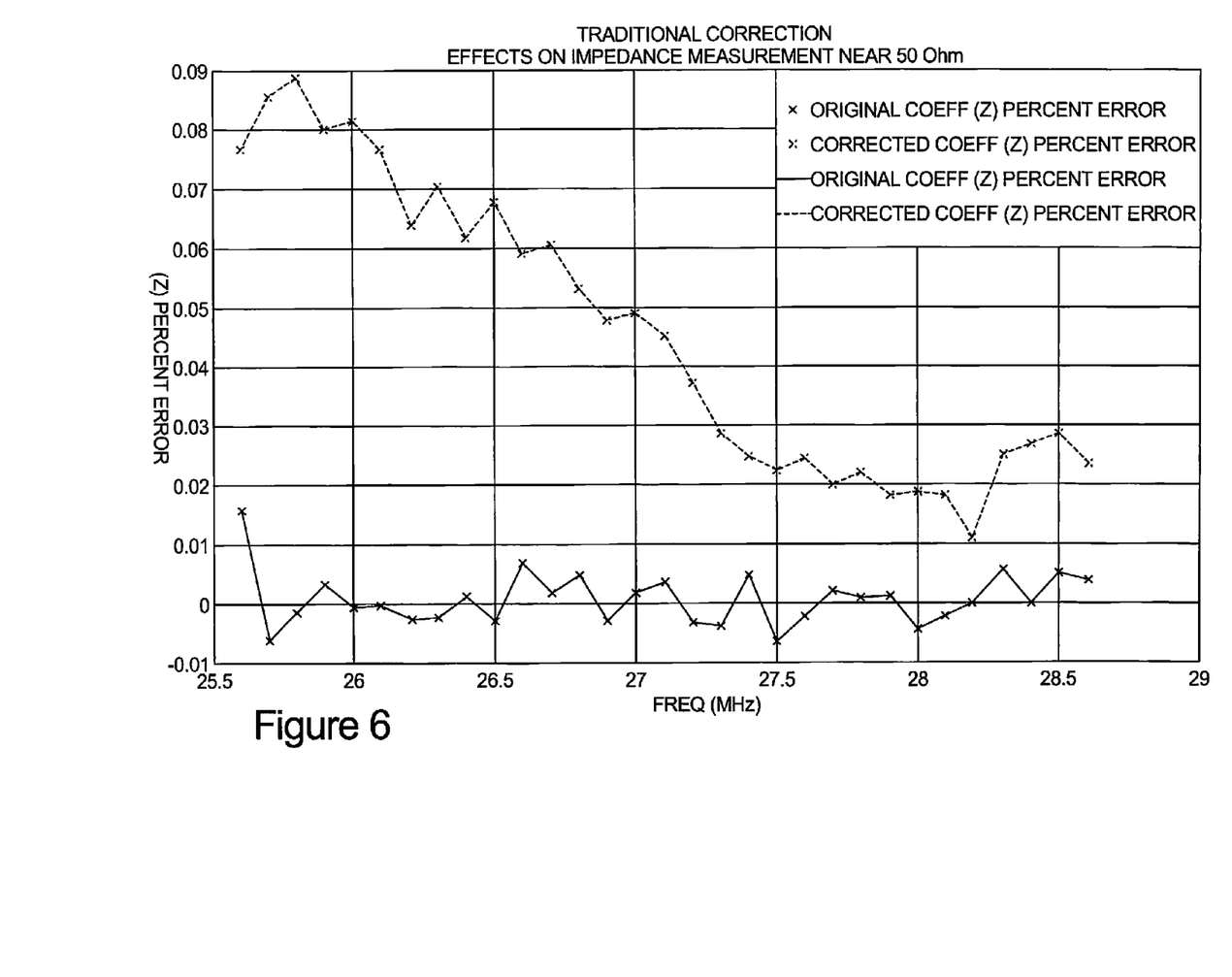
FIG. 6 is a plot showing the effects of a traditional error correction on the measured impedance.
Figure 7:
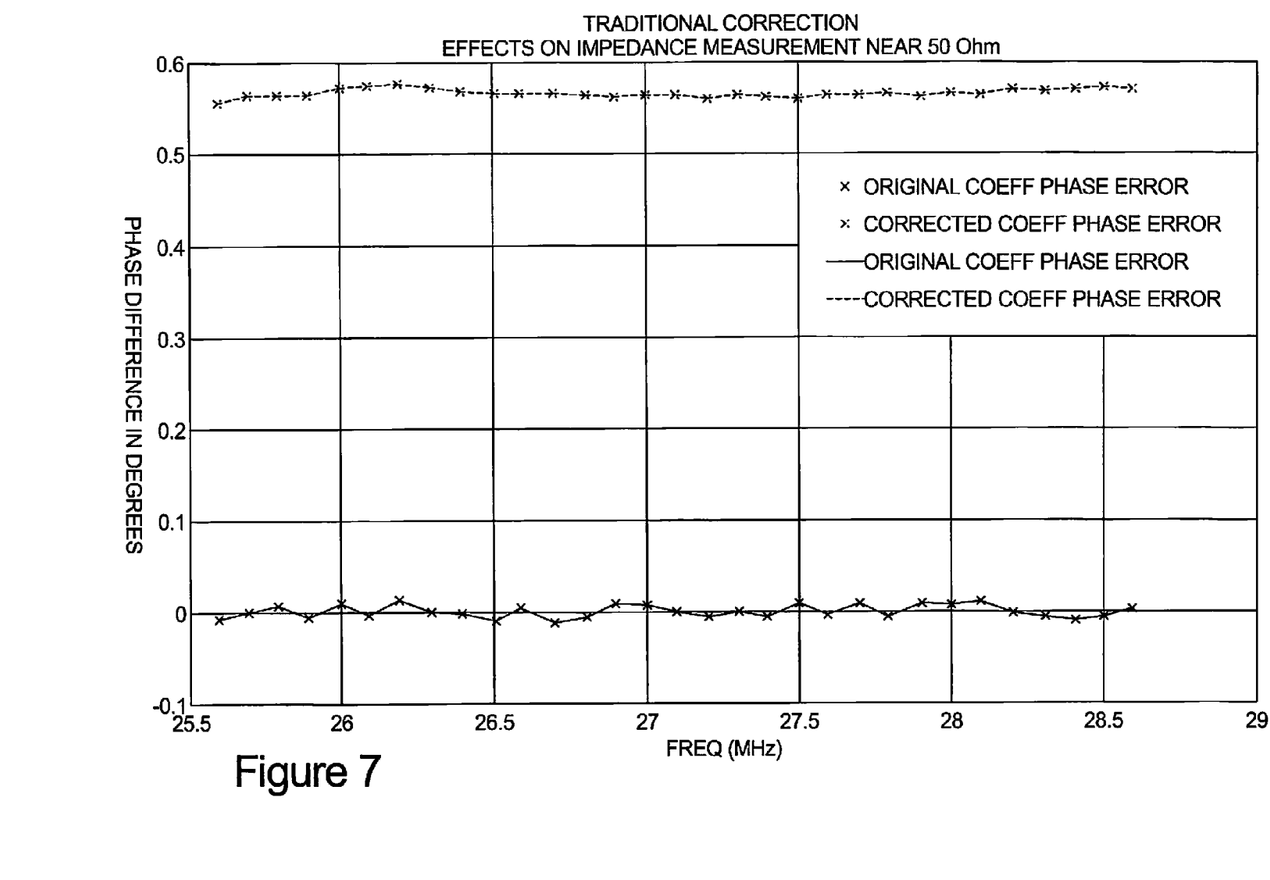
FIG. 7 is a plot showing the effects of traditional error correction on measured phase.

Previously, there was a limited understanding of the accuracy limitation described above. Several algorithms were implemented to address the above-described accuracy limitation with a VI probe. One solution consisted simply of measuring the impedance error vector—base-lined using a network analyzer—and modifying two of the four calibration coefficients in order to zero out the error when measuring that specific load (see equation 6). This solution, however, has consequences on the corrected frequencies in other regions of the Smith chart as can be seen in FIGS. 6 and 7. In FIGS. 6 and 7 the effects of correcting a 27 MHz signal for a near short load can be seen to negatively affect the impedance measurement performance at 50 ohms. It can also be safely assumed that the power measurements, even though only specified in a 50 ohm load, will be negatively affected, as can be deduced from the phase changes illustrated in FIG. 7. Furthermore, all other parameters measured by a VI probe will also be negatively affected besides the already discussed delivered power and impedance. These other factors include r, VSWR, forward power, reflected power and apparent power. From observing the raw calibration data, it can be easily noted that the calibration equipment performance is far from optimal into short and open load conditions. Coupled with a bad signal to noise ratio at the input of the analog to digital converters, the end result of these imperfections is a distorted, shifted, and compressed performance spread over the Smith chart.

SUMMARY

The present disclosure relates to a calibration method for performing open circuit and closed circuit calibrations of a voltage/current (VI) probe. In one implementation the method may comprise inserting a VI probe into a circuit including a first known load (Load 1) and a applying a first signal to the circuit. A first raw impedance ($Z_{RAW1}$) may be measured using the Load 1. The VI probe may then be inserted into the circuit along with a second known load (Load 2) in place of the Load 1, and second signal may be applied to the circuit. A second raw impedance ($Z_{RAW2}$) may then be measured using the Load 2. A fixed reference impedance ($Z_{R50}$) may then be defined. The first and second raw impedances, and the fixed reference impedance, may then be used in determining an open circuit impedance ($Z_{OC}$) and a short circuit impedance ($Z_{SC}$). The $Z_{OC}$ and $Z_{SC}$ impedances may then be used to determine a plurality of calibration coefficients for the VI probe.

In another aspect a calibration method is disclosed for performing open circuit and closed circuit calibrations of a voltage/current (VI) probe. The method may comprise inserting a VI probe into a circuit including a first known load (Load 1) and applying an RF signal to the circuit from a radio frequency (RF) signal generator. A first raw impedance ($Z_{RAW1}$) may then be measured using the Load 1. A second known load (Load 2) may then be inserted into the circuit in place of the Load 1, and the RF signal applied to the circuit from the RF signal generator. A second raw impedance ($Z_{RAW2}$) using the Load 2 may then be measured. A fixed reference impedance ($Z_{R50}$) may then be defined. A parameterized open circuit, short circuit and fixed reference equation may then be used to determine an open circuit impedance ($Z_{OC}$) and a short circuit impedance ($Z_{SC}$). The $Z_{OC}$ and $Z_{SC}$ impedances may then be used to determine a plurality of calibration coefficients for the VI probe.

In another aspect of the present disclosure a calibration method is disclosed for performing open circuit and closed circuit calibrations of a voltage/current (VI) probe. The method may comprise providing a computer that is placed in communication with a circuit. The computer may be used to control a radio frequency (RF) signal generator that generates an RF signal that is applied to the circuit. A first known load (Load 1) may be inserted into the circuit. A VI probe may then be inserted into the circuit and the RF signal may be applied to the circuit from the RF signal generator. The VI probe may then be used to measure a first raw voltage and a first raw current related to the Load 1. The first raw voltage and the first raw current values obtained by the VI probe relating to the Load 1 may be used to determine a first raw impedance ($Z_{RAW1}$) using the Load 1. The Load 1 may then be removed and a second known load (Load 2) may be inserted into the circuit. The RF signal may then be applied to the circuit and the VI probe may be used to measure a second raw voltage and a second raw current relating to the second known load (Load 2). The second raw voltage and the second raw current values obtained by the VI probe relating to the Load 2 may be used to determine a second raw impedance ($Z_{RAW2}$) using the Load 2. A fixed reference impedance ($Z_{R50}$) may then be determined. A parameterized open circuit, short circuit and fixed reference equation may then be used to determine an open circuit impedance ($Z_{OC}$) and a short circuit impedance ($Z_{SC}$). The $Z_{OC}$ and $Z_{SC}$ impedances may then be used to determine a plurality of calibration coefficients for the VI probe.

The present disclosure relates to a method for performing open circuit and short circuit calibrations on a voltage/current (VI) probe inserted in an RF transmission line between an RF signal generator and a load. The method involves sequentially substituting two known impedances (Load 1 and Load 2) as the loads into a circuit including the VI probe and an RF signal generator. The raw impedance of each of Load 1 and Load 2 is determined. A raw impedance of a fixed reference impedance ($Z_{R50}$) is also obtained in a separate measurement operation. The raw impedances of Load 1, Load 2, and the raw impedance of $Z_{R50}$ are then used with a short-open-fixed impedance parameterized equation to determine the open circuit ($Z_{OC}$) and short circuit ($Z_{SC}$) values. The $Z_{OC}$ and $Z_{SC}$ values can then be used to mathematically determine specific calibration coefficients for the VI probe.

The method enables even more accurate calibration of a probe by significantly reducing the errors that arise from using actual open circuit and short circuits during the open and short circuit calibrations on a VI probe. The method further reduces measurement error by a VI probe over the entire Smith chart, as well as enhancing unit-to-unit repeatability of VI probes calibrated at high frequencies, in accordance with the present method.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application or uses.

The present disclosure relates to a new calibration method that involves substituting the open circuit and short circuit calibrations with two different characterized loads chosen so that they do not cause undesirable performance of the amplifier being used for the calibration procedure and to provide a good signal to noise ratio for both the voltage and the current signals received from the voltage and the current pickups respectively. The theoretical open and short locations can then be computationally derived using the known loads and the raw data collected during calibration.

Figure 8:
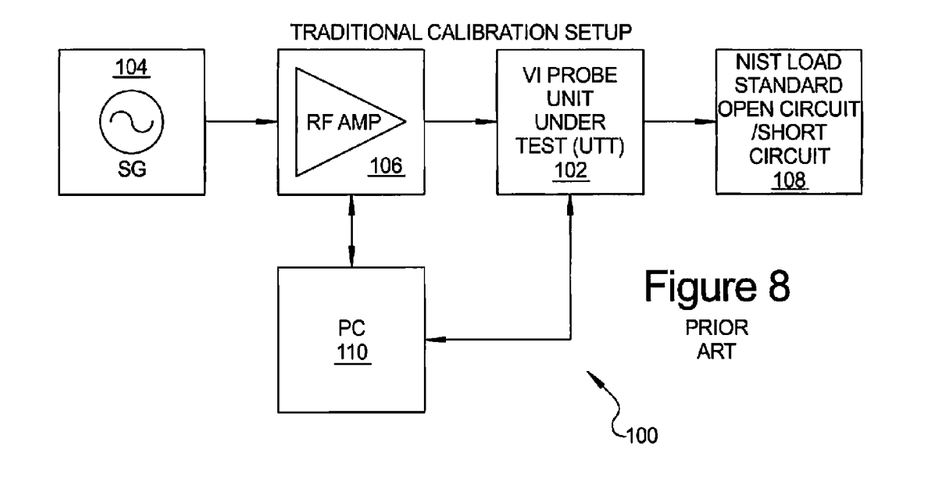
FIG. 8 is a block diagram of a prior art circuit for calibrating a VI probe in accordance with a traditional calibration method for performing open and short circuit calibrations.

Initially, with reference to FIG. 8, a prior art depiction of a circuit 100 for calibrating a voltage/current probe 102, hereinafter "VI probe 102" (i.e., the "unit under test"; UUT) is shown. The circuit 100 includes a radio frequency (RF) signal generator 104 for supplying an RF signal, an RF amplifier 106, and a computer 110 such as a personal computer (PC). The computer 110 controls the operation of the RF signal generator 104 and the RF amplifier 106, and receives raw current and raw voltage information from the VI probe 102. Three different loads 108 are used during calibration of the VI probe 102, which include 1) a NIST ("National Institute of Standards and Technology") load standard 50 ohm impedance; 2) an open circuit; and 3) a short circuit. The above-described measurement errors with the conventional calibration operation described in the "Background" section hereof are believed to originate with the raw voltage and current measurements obtained from the VI probe 102 during the open and short circuit calibration measurements.

Figure 9:
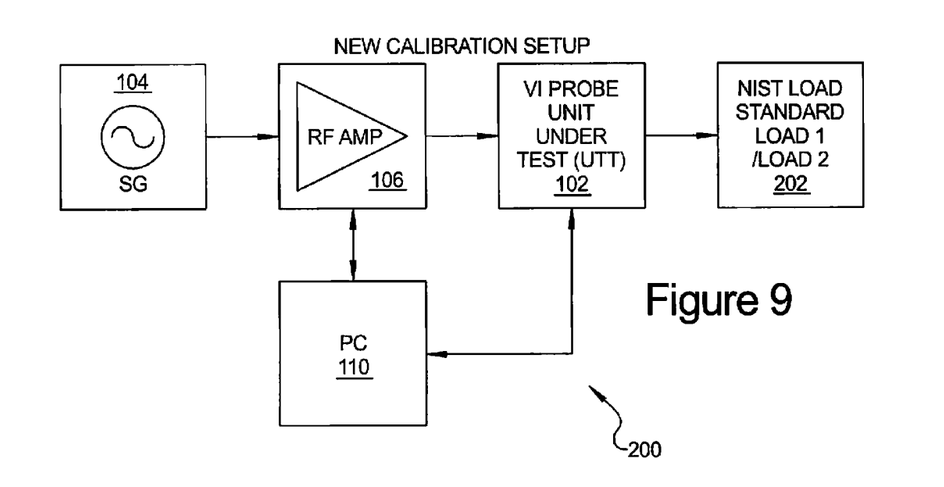
FIG. 9 is a block diagram of a circuit in which two known impedances are used during the open and short circuit calibration operations, in accordance with the present disclosure.

Referring to FIG. 9, a circuit 200 is shown for implementing the method of the present disclosure. The circuit 200 is identical to the circuit 100 with the exception that two known impedance loads "Load 1" and "Load 2" are used for the open circuit and short circuit calibration operations. In one exemplary implementation Load 1 may comprise a 16 ohm impedance and Load 2 may comprise a 300 ohm impedance. However, it will be appreciated that these are merely exemplary impedance values, and that essentially any two fixed impedances could be used with the method of the present disclosure. Thus, instead of performing the open circuit calibration operation on the VI probe 102 with an open circuit for the load, Load 1 is connected as the load. And instead of performing the short circuit calibration operation with a short circuit for the load, Load 2 is connected in to the circuit as the load.

Initially, the present method involves expressing the voltage and the current in an appropriate form that allows the isolation of the error sources. Listed below is a step-by-step derivation of the impedance (V & I ratio) from the direct matrix transformation into a parameterized short-open-reference fixed impedance equation, which for simplicity will be referred to as the "short-open-50 ohm parameterized equation". The derivation of the short-open-50 ohm parameterized equation is as follows:

$$Z_{mes} = \frac{V}{I} = \frac{a*V_v + b*V_i}{c*V_v + d*V_i} \Rightarrow Z_{mes} = \quad \text{Equation 7}$$

$$\frac{\sqrt{Z_{LDT}*P_{REF}}}{\sqrt{\frac{Z_{LDT}*P_{REF}}{Z_{LDT}}}} * \frac{\frac{V_v - Z_{SC}*V_i}{V_{V50} - Z_{SC}*V_{I50}}}{\frac{V_v - Z_{OC}*V_i}{V_{V50} - Z_{OC}*V_{I50}}} \Rightarrow Z_{mes} =$$

$$Z_{LDT} * \frac{V_v - Z_{SC}*V_i}{V_v - Z_{OC}*V_i} * \frac{V_{V50} - Z_{OC}*V_{I50}}{V_{V50} - Z_{SC}*V_{I50}} \Rightarrow Z_{mes} =$$

$$Z_{LDT} * \frac{Z_{Raw} - Z_{SC}}{Z_{Raw} - Z_{OC}} * \frac{Z_{R50} - Z_{OC}}{Z_{R50} - Z_{SC}}$$

where
$V_V$ is the raw voltage at the connect load;
$V_i$ is the raw current through the connected load;
$Z_{mes}$ is the measured impedance of the connected load;
$Z_{Raw}$ is the raw impedance of the connected load;
$Z_{LDT}$ is the 50 ohm reference load descriptor table used during calibration with a network analyzer;
$Z_{R50}$ is the raw measured impedance during the 50 ohm portion of the calibration;

$Z_{SC}$ is the raw measured impedance during the short-circuit calibration; and
$Z_{OC}$ is the raw measured impedance during the open-circuit calibration.

Obtaining the analytical form of the measured impedance (the measured impedance being set forth in equation 7) is highly important to isolating the open circuit and short circuit load impedances, which will allow re-deriving their exact impedances for short and open circuit conditions, based on any two reference points on the Smith chart. The reference points in the plane (i.e., on the Smith chart) will lead to the following two expressions for $Z_{LDT1}$ and $Z_{LDT2}$ with $Z_{oc}$ and $Z_{sc}$ being the unknowns:

$$\begin{cases} Z_{LDT1} = Z_{LDT} * \frac{Z_{Raw1} - Z_{SC}}{Z_{Raw1} - Z_{OC}} * \frac{Z_{R50} - Z_{OC}}{Z_{R50} - Z_{SC}} \\ Z_{LDT2} = Z_{LDT} * \frac{Z_{Raw2} - Z_{SC}}{Z_{Raw2} - Z_{OC}} * \frac{Z_{R50} - Z_{OC}}{Z_{R50} - Z_{SC}} \end{cases}$$

Now solving for the balanced $Z_{OC}$ and $Z_{SC}$ is possible, and the solution to the above system is given in terms of the calibration parameters as follows:

$$\begin{cases} Z_{SC} = \frac{Z_{OC}\left(\frac{Z_{LDT1}}{Z_{LDT}}Z_{R50} - Z_{Raw1}\right) - Z_{R50}Z_{Raw1}\left(\frac{Z_{LDT1}}{Z_{LDT}} - 1\right)}{Z_{OC}\left(\frac{Z_{LDT1}}{Z_{LDT}} - 1\right) + Z_{R50} - Z_{Raw1}\frac{Z_{LDT1}}{Z_{LDT}}} \\ \\ Z_{OC} = \frac{Z_{R50}\left[Z_{Raw1}\left(\frac{Z_{LDT1}}{Z_{LDT}} - 1\right) - Z_{Raw2}\left(\frac{Z_{LDT2}}{Z_{LDT}} - 1\right)\right] - Z_{Raw1}Z_{Raw2}\left(\frac{Z_{LDT1}}{Z_{LDT}} - \frac{Z_{LDT2}}{Z_{LDT}}\right)}{Z_{R50}\left(\frac{Z_{LDT1}}{Z_{LDT}} - \frac{Z_{LDT2}}{Z_{LDT}}\right) + Z_{Raw1}\left(\frac{Z_{LDT2}}{Z_{LDT}} - 1\right) - Z_{Raw2}\left(\frac{Z_{LDT1}}{Z_{LDT}} - 1\right)} \end{cases}$$

Once $Z_{OC}$ and $Z_{SC}$ are obtained, the calibration coefficients can be computed using equations (2), (3), (4) and (5).

Figure 10:
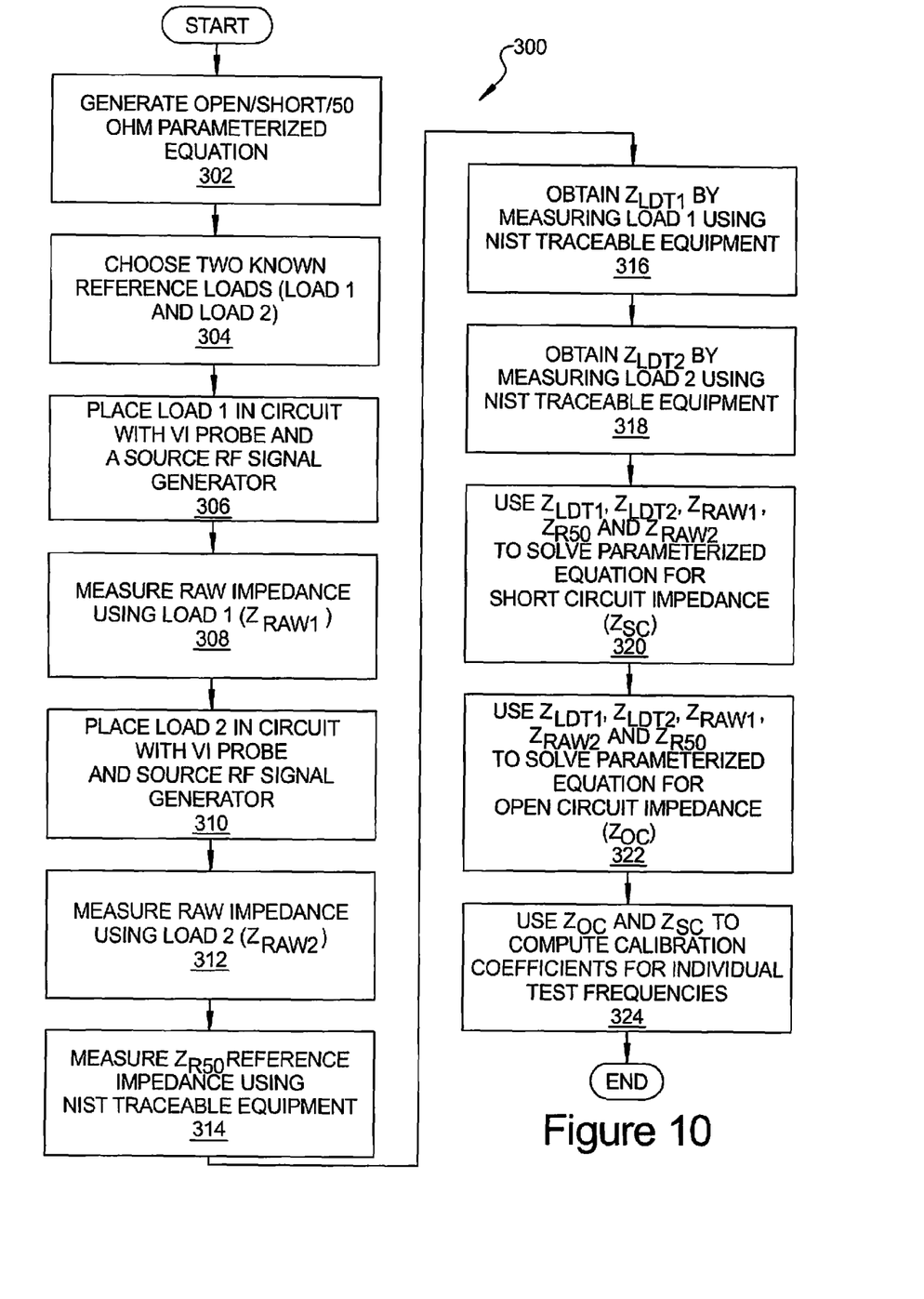
FIG. 10 is a flowchart illustrating operations performed in using the two known impedances to effect open and short circuit calibration of the VI probe.

Referring to FIG. 10, the method is summarized in the flowchart 300. At operation 302, the open/short/50 ohm parameterized equation is generated. At operation 304, two known reference loads (Load 1 and Load 2) are selected. At operation 306 reference Load 1 is placed in the circuit 200 with the VI probe 102. At operation 308, the raw impedance of Load 1 ($Z_{RAW1}$) is measured. At operation 310 the known fixed reference Load 2 is placed in the circuit 200 in place of Load 1. At operation 312, the impedance of Load 2 ($Z_{RAW2}$) is measured. At operation 314 $Z_{R50}$ is placed in the circuit in place of Load 2 and the impedance measured using NIST traceable equipment. At operation 316, $Z_{LDT1}$ is obtained by placing Load 1 back in the circuit 200 as the load and measuring the load impedance directly using NIST traceable measurement equipment (i.e., typically an NIST traceable network analyzer). At operation 318 $Z_{LDT2}$ is obtained by placing Load 2 back in the circuit 200 as the load and measuring the load impedance directly using NIST traceable measurement equipment. At operation 320, the open-short-50 ohm parameterized equation is solved for the short circuit impedance ($Z_{SC}$). At operation 322 the open-short-50 ohm parameterized equation is then solved for the open circuit impedance ($Z_{OC}$). At operation 324 the $Z_{OC}$ and $Z_{SC}$ values are used to compute the calibration coefficients "a", "b", "c" and "d", for use with equations 2-5, respectively, for individual test frequencies.

Using the method described herein, the theoretical open and short locations can be computationally derived from using the known Load 1 and Load 2 and the raw data collected during calibration.

The new calibration method described herein reduces the measurement error over the Smith chart as a whole, enhances the unit-to-unit repeatability of the VI Probe at high frequencies, and leads to a more balanced transformation matrix that is expected to agree with the measurement results of a network analyzer all across the Smith chart. Accordingly, this calibration method provides an improvement in the accuracy of both impedance and power measurements.

Figure 11:
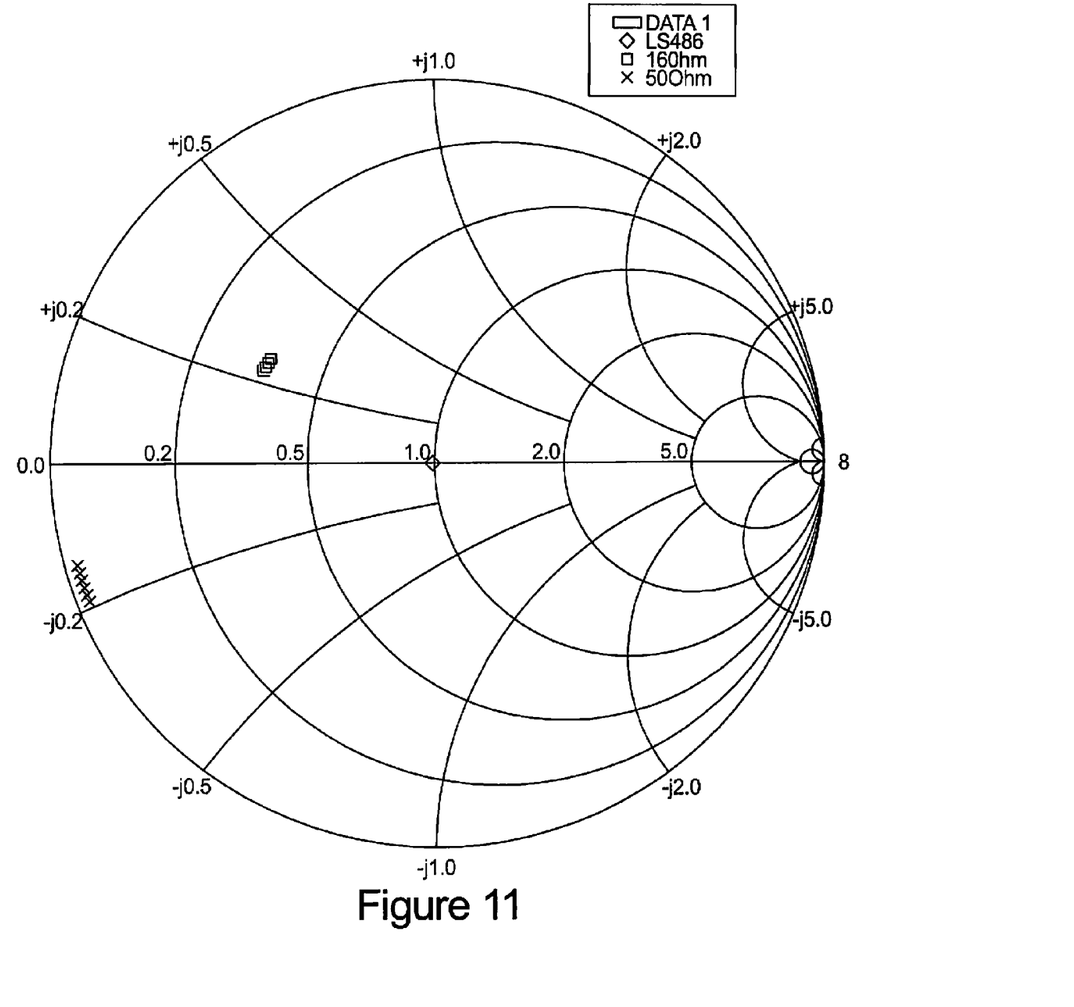
FIG. 11 is a Smith chart plot of the reference loads substituting the open and short conditions, obtained from a MATLAB® software simulation.
Figure 12:
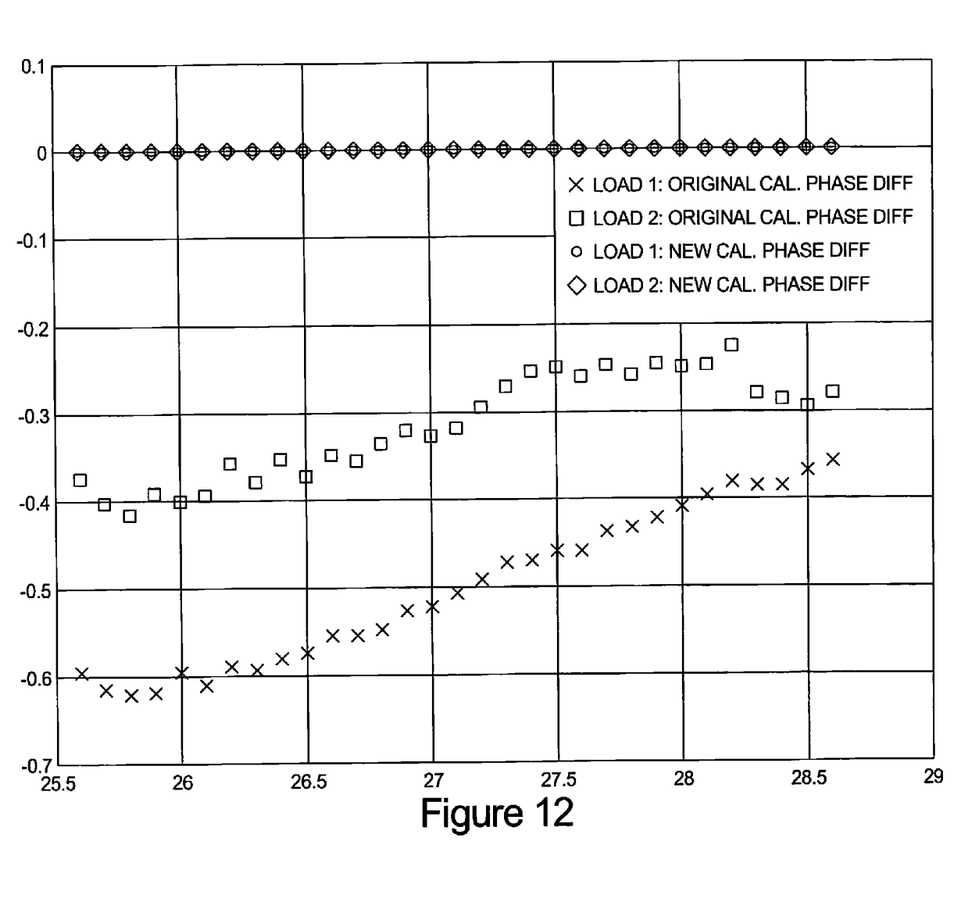
FIG. 12 is a graph showing the phase error having been zeroed out at the calibration loads, along with the initial phase error present with the original calibration (i.e., using open and short circuits during the original calibration)
Figure 13:
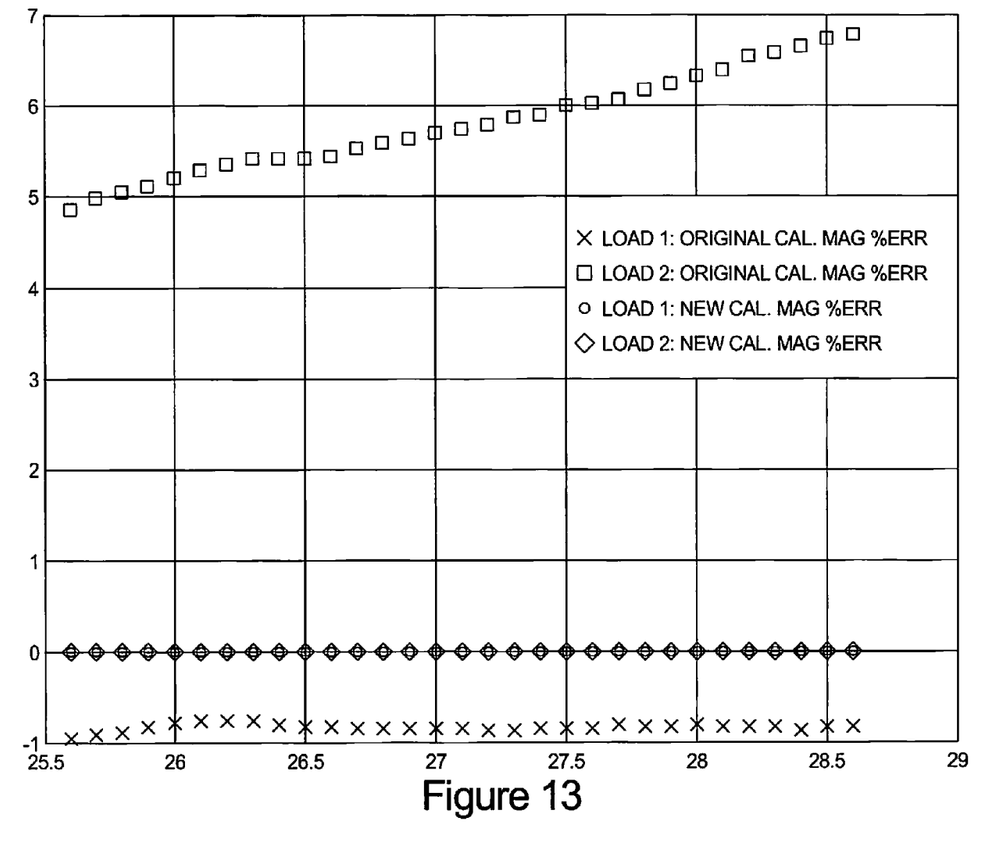
FIG. 13 is a graph showing the magnitude error having been zeroed out using the new calibration method of the present disclosure, along with the magnitude error produced with the original calibration (i.e., using open and short circuits during the original calibration).

The new calibration method described herein has been simulated in MATLAB® computational software, although the method is not necessarily limited to use only with MATLAB® computational software. The simulation results agreed with the theoretical analysis. The concept validation was based on actual VI probe data. The data used was obtained from an original calibration file for a specific VI probe, and two validations into two different loads at the same frequencies. The study was initially conducted over frequencies ranging from 25.6 MHz to 28.6 MHz at 100 KHz intervals. The two reference loads substituting for the open circuit and short circuit conditions are plotted in the Smith chart shown in FIG. 11. The simulation showed that the error was completely zeroed out at the calibration loads, both in terms of impedance magnitude and phase, as shown in FIGS. 12 and 13.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A calibration method for performing open circuit and closed circuit calibrations of a voltage/current (VI) probe, the method comprising:
   inserting a VI probe into a circuit including a first known load, Load 1 and applying a first signal to the circuit;
   measuring a first raw impedance ($Z_{RAW1}$) using the Load 1;
   inserting the VI probe into a circuit including a second known load, Load 2 and applying a second signal to the circuit;
   measuring a second raw impedance ($Z_{RAW2}$) using the Load 2;
   defining a fixed reference impedance, $Z_{R50}$;
   using the first and second raw impedances, and the fixed reference impedance, in determining an open circuit impedance, $Z_{OC}$ and a short circuit impedance, $Z_{SC}$; and
   using $Z_{OC}$ and $Z_{SC}$ to determine a plurality of calibration coefficients for the VI probe.

2. The method of claim 1, wherein determining an open circuit impedance ($Z_{OC}$) and a short circuit impedance ($Z_{SC}$) comprises using a parameterized open circuit, short circuit and fixed impedance equation in connection with the first and second raw impedances and the fixed reference impedance.

3. The method of claim 2, wherein using a parameterized open circuit, short circuit and fixed impedance equation comprises:
   defining a measured impedance by the formulas:

$$\begin{cases} Z_{LDT1} = Z_{LDT} * \dfrac{Z_{Raw1} - Z_{SC}}{Z_{Raw1} - Z_{OC}} * \dfrac{Z_{R50} - Z_{OC}}{Z_{R50} - Z_{SC}} \\ Z_{LDT2} = Z_{LDT} * \dfrac{Z_{Raw2} - Z_{SC}}{Z_{Raw2} - Z_{OC}} * \dfrac{Z_{R50} - Z_{OC}}{Z_{R50} - Z_{SC}} \end{cases}$$

and $$\begin{cases} Z_{SC} = \dfrac{Z_{OC}\left(\frac{Z_{LDT1}}{Z_{LDT}} Z_{R50} - Z_{Raw1}\right) - Z_{R50} Z_{Raw1}\left(\frac{Z_{LDT1}}{Z_{LDT}} - 1\right)}{Z_{OC}\left(\frac{Z_{LDT1}}{Z_{LDT}} - 1\right) + Z_{R50} - Z_{Raw1}\frac{Z_{LDT1}}{Z_{LDT}}} \\ Z_{OC} = \dfrac{Z_{R50}\left[Z_{Raw1}\left(\frac{Z_{LDT1}}{Z_{LDT}} - 1\right) - Z_{Raw2}\left(\frac{Z_{LDT2}}{Z_{LDT}} - 1\right)\right] - Z_{Raw1} Z_{Raw2}\left(\frac{Z_{LDT1}}{Z_{LDT}} - \frac{Z_{LDT2}}{Z_{LDT}}\right)}{Z_{R50}\left(\frac{Z_{LDT1}}{Z_{LDT}} - \frac{Z_{LDT2}}{Z_{LDT}}\right) + Z_{Raw1}\left(\frac{Z_{LDT2}}{Z_{LDT}} - 1\right) - Z_{Raw2}\left(\frac{Z_{LDT1}}{Z_{LDT}} - 1\right)} \end{cases}$$

where $Z_{LDT1}$ is the measured impedance of Load 1 as measured by a network analyzer;
$Z_{LDT2}$ is the measured impedance of Load 2 as measured by the network analyzer;
$Z_{RAW1}$ is the raw impedance of Load 1;
$Z_{RAW2}$ is the raw impedance of Load 2;
$Z_{LDT}$ is a fixed reference load descriptor table used during calibration;
$Z_{R50}$ is the raw measured impedance during a previously performed calibration operation using the fixed reference impedance;
$Z_{SC}$ is the raw measured impedance during a short-circuit calibration procedure; and
$Z_{OC}$ is the raw measured impedance during the open-circuit calibration.

4. The method of claim 3, wherein determining the calibration coefficients comprises determining four calibration constants a, b, c, and d using $Z_{SC}$ and $Z_{OC}$ as follows:

$$a = -\dfrac{\sqrt{Z_{LDT} * P_{REF}}}{-V_{V50} + Z_{SC} * V_{I50}}$$

$$b = \dfrac{\sqrt{Z_{LDT} * P_{REF}} * Z_{SC}}{-V_{V50} + Z_{SC} * V_{I50}}$$

$$c = \dfrac{\sqrt{Z_{LDT} * P_{REF}}}{Z_{LDT} * (-V_{V50} + Z_{OC} * V_{I50})}$$

$$d = \dfrac{\sqrt{Z_{LDT} * P_{REF}} * Z_{OC}}{Z_{LDT} * (-V_{V50} + Z_{OC} * V_{I50})}$$

where $P_{REF}$ is the calibration reference power into a 50 Ohm load;
$V_{V50}$ is the raw voltage of the reference impedance sensed by the VI probe; and
$V_{I50}$ is the raw current through the reference impedance as sensed by the VI probe.

5. The method of claim 4, wherein using $Z_{R50}$ comprises using a 50 ohm impedance.

6. The method of claim 1, wherein applying the first and second signals to the circuit comprises using a radio frequency (RF) signal generator to generate first and second RF signals that are applied to the circuit.

7. The method of claim 1, further comprising:
   using a computer to control the RF signal generator and to receive raw voltage and raw current signals from the VI probe; and
   using the raw voltage and raw current signals to calculate the first and second raw impedances.

8. The method of claim 1, wherein using the $Z_{R50}$ impedance comprises using a load standard 50 ohm impedance.

9. A calibration method for performing open circuit and closed circuit calibrations of a voltage/current (VI) probe, the method comprising:
  inserting a VI probe into a circuit including a first known load, Load 1 and applying an RF signal to the circuit from a radio frequency (RF) signal generator;
  measuring a first raw impedance ($Z_{RAW1}$) using the Load 1;
  inserting the VI probe into a circuit including a second known load, Load 2 and applying the RF signal to the circuit from the RF signal generator;
  measuring a second raw impedance ($Z_{RAW2}$) using the Load 2;
  defining a fixed reference impedance ($Z_{R50}$);
  generating a parameterized open circuit, short circuit and fixed impedance equation based on the first and second raw impedances, and the fixed reference impedance;
  using the parameterized open circuit, short circuit and fixed impedance equation to determine an open circuit impedance, Zoc and a short circuit impedance, Zsc; and
  using ZOC and ZSC to determine a plurality of calibration coefficients for the VI probe.

10. The method of claim 9, wherein using a parameterized open circuit, short circuit and fixed impedance equation comprises:
  defining a measured impedance by the formulas:

$$\begin{cases} Z_{LDT1} = Z_{LDT} * \dfrac{Z_{Raw1} - Z_{SC}}{Z_{Raw1} - Z_{OC}} * \dfrac{Z_{R50} - Z_{OC}}{Z_{R50} - Z_{SC}} \\ Z_{LDT2} = Z_{LDT} * \dfrac{Z_{Raw2} - Z_{SC}}{Z_{Raw2} - Z_{OC}} * \dfrac{Z_{R50} - Z_{OC}}{Z_{R50} - Z_{SC}} \end{cases}$$

and $$\begin{cases} Z_{SC} = \dfrac{Z_{OC}\left(\dfrac{Z_{LDT1}}{Z_{LDT}} Z_{R50} - Z_{Raw1}\right) - Z_{R50} Z_{Raw1}\left(\dfrac{Z_{LDT1}}{Z_{LDT}} - 1\right)}{Z_{OC}\left(\dfrac{Z_{LDT1}}{Z_{LDT}} - 1\right) + Z_{R50} - Z_{Raw1}\dfrac{Z_{LDT1}}{Z_{LDT}}} \\ Z_{OC} = \dfrac{Z_{R50}\left[Z_{Raw1}\left(\dfrac{Z_{LDT1}}{Z_{LDT}} - 1\right) - Z_{Raw2}\left(\dfrac{Z_{LDT2}}{Z_{LDT}} - 1\right)\right] - Z_{Raw1} Z_{Raw2}\left(\dfrac{Z_{LDT1}}{Z_{LDT}} - \dfrac{Z_{LDT2}}{Z_{LDT}}\right)}{Z_{R50}\left(\dfrac{Z_{LDT1}}{Z_{LDT}} - \dfrac{Z_{LDT2}}{Z_{LDT}}\right) + Z_{Raw1}\left(\dfrac{Z_{LDT2}}{Z_{LDT}} - 1\right) - Z_{Raw2}\left(\dfrac{Z_{LDT1}}{Z_{LDT}} - 1\right)} \end{cases}$$

where $Z_{LDT1}$ is the measured impedance of Load 1 as measured by a network analyzer;
$Z_{LDT2}$ is the measured impedance of Load 2 as measured by the network analyzer;
$Z_{RAW1}$ is the raw impedance of Load 1;
$Z_{RAW2}$ is the raw impedance of Load 2;
$Z_{LDT}$ is a fixed reference load descriptor table used during calibration;
$Z_{R50}$ is the raw measured impedance during a previously performed calibration operation using the fixed reference impedance;
$Z_{SC}$ is the raw measured impedance during a short-circuit calibration procedure; and
$Z_{OC}$ is the raw measured impedance during the open-circuit calibration.

11. The method of claim 10, wherein determining the calibration coefficients comprises determining four calibration constants a, b, c, and d using $Z_{SC}$ and $Z_{OC}$ as follows:

$$a = -\frac{\sqrt{Z_{LDT} * P_{REF}}}{-V_{V50} + Z_{SC} * V_{I50}}$$

$$b = \frac{\sqrt{Z_{LDT} * P_{REF}} * Z_{SC}}{-V_{V50} + Z_{SC} * V_{I50}}$$

$$c = \frac{\sqrt{Z_{LDT} * P_{REF}}}{Z_{LDT} * (-V_{V50} + Z_{OC} * V_{I50})}$$

$$d = \frac{\sqrt{Z_{LDT} * P_{REF}} * Z_{OC}}{Z_{LDT} * (-V_{V50} + Z_{OC} * V_{I50})}$$

where $P_{REF}$ is the calibration reference power into a 50 Ohm load;
$V_{V50}$ is the raw voltage of the reference impedance sensed by the VI probe; and
$V_{I50}$ is the raw current through the reference impedance as sensed by the VI probe.

12. The method of claim 11, wherein using $Z_{R50}$ comprises using a 50 ohm impedance.

13. The method of clam 9, further comprising using a radio frequency (RF) amplifier to receive the RF signal and to amplify the RF signal before the RF signal is applied to the circuit.

14. The method of claim 13, further comprising using a computer to control the RF signal generator and to receive raw voltage and raw current signals from the VI probe; and
  using the raw voltage and raw current signals to calculate the first and second raw impedances.

15. A calibration method for performing open circuit and closed circuit calibrations of a voltage/current (VI) probe, the method comprising:
  providing a computer that is placed in communication with a circuit;
  using the computer to control a radio frequency (RF) signal generator that generates an RF signal that is applied to the circuit;
  inserting a first known load, Load 1 into the circuit;
  inserting a VI probe into the circuit and applying the RF signal to the circuit from the RF signal generator;
  using the VI probe to measure a first raw voltage and a first raw current related to the Load 1;
  using the first raw voltage and the first raw current values obtained by the VI probe relating to the Load 1 to determine a first raw impedance ($Z_{RAW1}$) using the Load 1;
  removing the Load 1 and inserting a second known load, Load 2 into the circuit;
  applying the RF signal to the circuit and using the VI probe to measure a second raw voltage and a second raw current relating to the second known load (Load 2);
  using the second raw voltage and the second raw current values obtained by the VI probe relating to the Load 2 to determine a second raw impedance ($Z_{RAW2}$) using the Load 2;
  defining a fixed reference impedance (Zr50);
  generating a parameterized open circuit, short circuit and fixed impedance equation based on the first and second raw impedances, and the fixed reference impedance;
  using the parameterized open circuit, short circuit and fixed impedance equation to determine an open circuit impedance, Zoc and a short circuit impedance, Zsc; and
  using $Z_{OC}$ and $Z_{SC}$ to determine a plurality of calibration coefficients for the VI probe.

16. The method of claim 15, wherein using a parameterized open circuit, short circuit and fixed reference equation comprises:

defining a measured impedance by the formulas:

$$\begin{cases} Z_{LDT1} = Z_{LDT} * \dfrac{Z_{Raw1} - Z_{SC}}{Z_{Raw1} - Z_{OC}} * \dfrac{Z_{R50} - Z_{OC}}{Z_{R50} - Z_{SC}} \\ Z_{LDT2} = Z_{LDT} * \dfrac{Z_{Raw2} - Z_{SC}}{Z_{Raw2} - Z_{OC}} * \dfrac{Z_{R50} - Z_{OC}}{Z_{R50} - Z_{SC}} \end{cases}$$

and $$\begin{cases} Z_{SC} = \dfrac{Z_{OC}\left(\dfrac{Z_{LDT1}}{Z_{LDT}}Z_{R50} - Z_{Raw1}\right) - Z_{R50}Z_{Raw1}\left(\dfrac{Z_{LDT1}}{Z_{LDT}} - 1\right)}{Z_{OC}\left(\dfrac{Z_{LDT1}}{Z_{LDT}} - 1\right) + Z_{R50} - Z_{Raw1}\dfrac{Z_{LDT1}}{Z_{LDT}}} \\ Z_{OC} = \dfrac{Z_{R50}\left[Z_{Raw1}\left(\dfrac{Z_{LDT1}}{Z_{LDT}} - 1\right) - Z_{Raw2}\left(\dfrac{Z_{LDT2}}{Z_{LDT}} - 1\right)\right] - Z_{Raw1}Z_{Raw2}\left(\dfrac{Z_{LDT1}}{Z_{LDT}} - \dfrac{Z_{LDT2}}{Z_{LDT}}\right)}{Z_{R50}\left(\dfrac{Z_{LDT1}}{Z_{LDT}} - \dfrac{Z_{LDT2}}{Z_{LDT}}\right) + Z_{Raw1}\left(\dfrac{Z_{LDT2}}{Z_{LDT}} - 1\right) - Z_{Raw2}\left(\dfrac{Z_{LDT1}}{Z_{LDT}} - 1\right)} \end{cases}$$

where $Z_{LDT1}$ is the measured impedance of Load 1 as measured by a network analyzer;
$Z_{LDT2}$ is the measured impedance of Load 2 as measured by the network analyzer;
$Z_{RAW1}$ is the raw impedance of Load 1;
$Z_{RAW2}$ is the raw impedance of Load 2;
$Z_{LDT}$ is a fixed reference load descriptor table used during calibration;
$Z_{R50}$ is the raw measured impedance during a previously performed calibration operation using the fixed reference impedance;

$Z_{SC}$ is the raw measured impedance during a short-circuit calibration procedure; and
$Z_{OC}$ is the raw measured impedance during the open-circuit calibration.

17. The method of claim 15, wherein using $Z_{R50}$ comprises using a 50 ohm impedance.

18. The method of claim 17, wherein using the $Z_{R50}$ impedance comprises using a load standard 50 ohm impedance.

19. The method of claim 16, wherein determining the calibration coefficients comprises determining four calibration constants a, b, c, and d using $Z_{SC}$ and $Z_{OC}$ as follows:

$$a = -\frac{\sqrt{Z_{LDT} * P_{REF}}}{-V_{V50} + Z_{SC} * V_{I50}}$$

$$b = \frac{\sqrt{Z_{LDT} * P_{REF}} * Z_{SC}}{-V_{V50} + Z_{SC} * V_{I50}}$$

$$c = \frac{\sqrt{Z_{LDT} * P_{REF}}}{Z_{LDT} * (-V_{V50} + Z_{OC} * V_{I50})}$$

$$d = \frac{\sqrt{Z_{LDT} * P_{REF}} * Z_{OC}}{Z_{LDT} * (-V_{V50} + Z_{OC} * V_{I50})}$$

where $P_{REF}$ is the calibration reference power into a 50 Ohm load;
$V_{V50}$ is the raw voltage of the reference impedance sensed by the VI probe; and
$V_{I50}$ is the raw current through the reference impedance as sensed by the VI probe.

20. The method of claim 15, further comprising using an RF amplifier to amplify the RF signal, and controlling the RF amplifier using the computer.

* * * * *